(12) United States Patent
Sandhu et al.

(10) Patent No.: US 7,927,948 B2
(45) Date of Patent: Apr. 19, 2011

(54) DEVICES WITH NANOCRYSTALS AND METHODS OF FORMATION

(75) Inventors: Gurtej S. Sandhu, Boise, ID (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 11/185,113

(22) Filed: Jul. 20, 2005

(65) Prior Publication Data

US 2007/0018342 A1    Jan. 25, 2007

(51) Int. Cl.
H01L 21/336 (2006.01)
(52) U.S. Cl. .................. 438/257; 438/962; 257/E29.3
(58) Field of Classification Search .......... 438/257, 438/962; 257/315, E29.3
See application file for complete search history.

(56) References Cited

U.S. PATENT DOCUMENTS

| | | |
|---|---|---|
| 3,407,479 A | 10/1968 | Fordemwalt et al. |
| 3,953,566 A | 4/1976 | Gore |
| 4,413,022 A | 11/1983 | Suntola et al. |
| 5,119,329 A | 6/1992 | Evans et al. |
| 5,149,596 A | 9/1992 | Smith et al. |
| 5,223,001 A | 6/1993 | Saeki |
| 5,304,622 A | 4/1994 | Ikai et al. |
| 5,353,431 A | 10/1994 | Doyle et al. |
| 5,382,533 A | 1/1995 | Ahmad et al. |
| 5,434,878 A | 7/1995 | Lawandy |
| 5,455,489 A | 10/1995 | Bhargava |
| 5,516,588 A | 5/1996 | van den Berg et al. |
| 5,530,581 A | 6/1996 | Cogan |
| 5,585,020 A | 12/1996 | Becker et al. |
| 5,593,912 A | 1/1997 | Rajeevakumar |
| 5,640,364 A | 6/1997 | Merrit et al. |
| 5,652,061 A | 7/1997 | Jeng et al. |
| 5,662,834 A | 9/1997 | Schulz et al. |
| 5,711,812 A | 1/1998 | Chapek et al. |
| 5,714,336 A | 2/1998 | Simons et al. |
| 5,714,766 A | 2/1998 | Chen et al. |
| 5,770,022 A | 6/1998 | Chang et al. |
| 5,772,760 A | 6/1998 | Gruen et al. |
| 5,849,628 A | 12/1998 | Sandhu et al. |
| 5,851,880 A | 12/1998 | Ikegami |
| 5,874,134 A | 2/1999 | Rao et al. |
| 5,882,779 A | 3/1999 | Lawandy |

(Continued)

OTHER PUBLICATIONS

Alers, G. B., et al., "Intermixing at the tantalum oxide/silicon interface in gate dielectric structures", *Applied Physics Letters*, 73(11), (Sep. 14, 1998), 1517-1519.

(Continued)

*Primary Examiner* — Lex Malsawma
(74) *Attorney, Agent, or Firm* — Schwegman, Lundberg & Woessner, P.A.

(57) ABSTRACT

An aspect relates to a method of growing nanoscale structures on a semiconductor substrate. According to various embodiments, nucleation sites are created on a surface of the substrate. The creation of the nucleation sites includes implanting ions with an energy and a dose selected to provide a controllable distribution of the nucleation sites across the surface of the substrate. Nanoscale structures are grown using the controllable distribution of nucleation sites to seed the growth of the nanoscale structures. According to various embodiments, the nanoscale structures include at least one of nanocrystals, nanowires and nanotubes. According to various nanocrystal embodiments, the nanocrystals are positioned within a gate stack and function as a floating gate for a nonvolatile device. Other aspects and embodiments are provided herein.

34 Claims, 3 Drawing Sheets

U.S. PATENT DOCUMENTS

| | | | |
|---|---|---|---|
| 5,897,363 A | 4/1999 | Gonzalez et al. | |
| 5,923,056 A | 7/1999 | Lee et al. | |
| 5,939,146 A | 8/1999 | Lavernia | |
| 5,945,704 A | 8/1999 | Schrems et al. | |
| 5,962,132 A | 10/1999 | Chang et al. | |
| 5,989,511 A | 11/1999 | Gruen et al. | |
| 5,991,225 A | 11/1999 | Forbes et al. | |
| 6,008,103 A | 12/1999 | Hoepfner | |
| 6,013,566 A | 1/2000 | Thakur et al. | |
| 6,018,174 A | 1/2000 | Schrems et al. | |
| 6,020,024 A | 2/2000 | Maiti et al. | |
| 6,020,243 A | 2/2000 | Wallace et al. | |
| 6,025,034 A | 2/2000 | Strutt et al. | |
| 6,046,059 A | 4/2000 | Shen et al. | |
| 6,054,349 A * | 4/2000 | Nakajima et al. | 438/257 |
| 6,060,743 A | 5/2000 | Sugiyama et al. | |
| 6,063,705 A | 5/2000 | Vaartstra | |
| 6,075,691 A | 6/2000 | Duenas et al. | |
| RE36,760 E | 7/2000 | Bloomquist et al. | |
| 6,129,928 A | 10/2000 | Sarangapani et al. | |
| 6,140,181 A | 10/2000 | Forbes et al. | |
| 6,143,631 A * | 11/2000 | Chapek | 438/513 |
| 6,146,976 A | 11/2000 | Stecher et al. | |
| H1924 H | 12/2000 | Zabinski et al. | |
| 6,159,874 A | 12/2000 | Tews et al. | |
| 6,162,712 A | 12/2000 | Baum et al. | |
| 6,166,401 A | 12/2000 | Forbes | |
| 6,182,604 B1 | 2/2001 | Goeckner et al. | |
| 6,184,550 B1 | 2/2001 | Van Buskirk et al. | |
| 6,194,237 B1 | 2/2001 | Kim et al. | |
| 6,200,873 B1 | 3/2001 | Schrems et al. | |
| 6,208,881 B1 | 3/2001 | Champeau | |
| 6,214,707 B1 | 4/2001 | Thakur et al. | |
| 6,218,293 B1 | 4/2001 | Kraus et al. | |
| 6,232,643 B1 | 5/2001 | Forbes et al. | |
| 6,246,606 B1 | 6/2001 | Forbes et al. | |
| 6,265,279 B1 | 7/2001 | Radens et al. | |
| 6,271,142 B1 | 8/2001 | Gruening et al. | |
| 6,277,448 B2 | 8/2001 | Strutt et al. | |
| 6,291,341 B1 | 9/2001 | Sharan et al. | |
| 6,297,095 B1 | 10/2001 | Muralidhar et al. | |
| 6,310,375 B1 | 10/2001 | Schrems | |
| 6,310,376 B1 | 10/2001 | Ueda et al. | |
| 6,312,999 B1 | 11/2001 | Chivukula et al. | |
| 6,313,015 B1 | 11/2001 | Lee et al. | |
| 6,313,035 B1 | 11/2001 | Sandhu et al. | |
| 6,313,495 B1 | 11/2001 | Shen et al. | |
| 6,316,275 B2 | 11/2001 | Hopfner | |
| 6,323,081 B1 | 11/2001 | Marsh | |
| 6,323,511 B1 | 11/2001 | Marsh | |
| 6,331,282 B1 | 12/2001 | Manthiram et al. | |
| 6,335,536 B1 | 1/2002 | Goeckner et al. | |
| 6,342,445 B1 | 1/2002 | Marsh | |
| 6,346,477 B1 | 2/2002 | Kaloyeros et al. | |
| 6,351,411 B2 | 2/2002 | Forbes et al. | |
| 6,359,310 B1 | 3/2002 | Gonzalez et al. | |
| 6,365,519 B2 | 4/2002 | Kraus et al. | |
| 6,372,567 B1 | 4/2002 | Tews et al. | |
| 6,392,257 B1 | 5/2002 | Ramdani et al. | |
| 6,395,650 B1 | 5/2002 | Callegari et al. | |
| 6,398,923 B1 | 6/2002 | Ireland et al. | |
| 6,403,414 B2 | 6/2002 | Marsh | |
| 6,407,435 B1 | 6/2002 | Ma et al. | |
| 6,414,543 B1 | 7/2002 | Beigel et al. | |
| 6,433,553 B1 | 8/2002 | Goeckner et al. | |
| 6,436,749 B1 | 8/2002 | Tonti et al. | |
| 6,437,381 B1 | 8/2002 | Gruening et al. | |
| 6,447,764 B1 | 9/2002 | Bayer et al. | |
| 6,447,848 B1 | 9/2002 | Chow et al. | |
| 6,448,601 B1 | 9/2002 | Forbes et al. | |
| 6,458,431 B2 | 10/2002 | Hill et al. | |
| 6,465,370 B1 | 10/2002 | Schrems et al. | |
| 6,472,302 B1 | 10/2002 | Lee | |
| 6,472,632 B1 | 10/2002 | Peterson et al. | |
| 6,475,859 B1 | 11/2002 | Tews et al. | |
| 6,495,458 B2 | 12/2002 | Marsh | |
| 6,496,034 B2 | 12/2002 | Forbes et al. | |
| 6,500,496 B1 | 12/2002 | Goeckner et al. | |
| 6,506,666 B2 | 1/2003 | Marsh | |
| 6,509,599 B1 | 1/2003 | Wurster et al. | |
| 6,511,905 B1 | 1/2003 | Lee et al. | |
| 6,521,956 B1 | 2/2003 | Lee | |
| 6,527,918 B2 | 3/2003 | Goeckner et al. | |
| 6,531,727 B2 | 3/2003 | Forbes et al. | |
| 6,541,280 B2 | 4/2003 | Kaushik et al. | |
| 6,544,888 B2 | 4/2003 | Lee | |
| 6,545,314 B2 | 4/2003 | Forbes et al. | |
| 6,559,014 B1 | 5/2003 | Jeon | |
| 6,559,491 B2 | 5/2003 | Forbes et al. | |
| 6,562,491 B1 | 5/2003 | Jeon | |
| 6,566,147 B2 | 5/2003 | Basceri et al. | |
| 6,566,682 B2 | 5/2003 | Forbes | |
| 6,572,836 B1 | 6/2003 | Schulz et al. | |
| 6,574,144 B2 | 6/2003 | Forbes | |
| 6,580,124 B1 | 6/2003 | Cleeves et al. | |
| 6,586,785 B2 | 7/2003 | Flagan et al. | |
| 6,586,797 B2 | 7/2003 | Forbes et al. | |
| 6,587,408 B1 | 7/2003 | Jacobson et al. | |
| 6,592,839 B2 | 7/2003 | Gruen et al. | |
| 6,613,695 B2 | 9/2003 | Pomarede et al. | |
| 6,617,634 B2 | 9/2003 | Marsh et al. | |
| 6,638,575 B1 | 10/2003 | Chen et al. | |
| 6,639,268 B2 | 10/2003 | Forbes et al. | |
| 6,642,567 B1 | 11/2003 | Marsh | |
| 6,642,782 B2 | 11/2003 | Beigel et al. | |
| 6,645,569 B2 | 11/2003 | Cramer et al. | |
| 6,653,591 B1 | 11/2003 | Peterson et al. | |
| 6,656,792 B2 | 12/2003 | Choi et al. | |
| 6,656,835 B2 | 12/2003 | Marsh et al. | |
| 6,660,631 B1 | 12/2003 | Marsh | |
| 6,669,823 B1 | 12/2003 | Sarkas et al. | |
| 6,669,996 B2 | 12/2003 | Ueno et al. | |
| 6,673,701 B1 | 1/2004 | Marsh et al. | |
| 6,676,595 B1 | 1/2004 | Delfino | |
| 6,677,204 B2 | 1/2004 | Cleeves et al. | |
| 6,689,192 B1 | 2/2004 | Phillips et al. | |
| 6,703,279 B2 | 3/2004 | Lee | |
| 6,709,912 B1 | 3/2004 | Ang et al. | |
| 6,713,329 B1 | 3/2004 | Wagner et al. | |
| 6,713,812 B1 | 3/2004 | Hoefler et al. | |
| 6,717,211 B2 | 4/2004 | Gonzalez et al. | |
| 6,723,606 B2 | 4/2004 | Flagan et al. | |
| 6,734,480 B2 | 5/2004 | Chung et al. | |
| 6,746,893 B1 | 6/2004 | Forbes et al. | |
| 6,753,567 B2 | 6/2004 | Maria et al. | |
| 6,754,108 B2 | 6/2004 | Forbes | |
| 6,755,886 B2 | 6/2004 | Phillips | |
| 6,756,292 B2 | 6/2004 | Lee et al. | |
| 6,767,419 B1 | 7/2004 | Branagan | |
| 6,767,582 B1 | 7/2004 | Elers | |
| 6,770,954 B2 | 8/2004 | Lee | |
| 6,784,101 B1 | 8/2004 | Yu et al. | |
| 6,787,122 B2 | 9/2004 | Zhou | |
| 6,801,415 B2 | 10/2004 | Slaughter et al. | |
| 6,803,275 B1 | 10/2004 | Park et al. | |
| 6,804,136 B2 | 10/2004 | Forbes | |
| 6,808,983 B2 | 10/2004 | Hill | |
| 6,815,781 B2 | 11/2004 | Vyvoda et al. | |
| 6,818,067 B2 | 11/2004 | Doering et al. | |
| 6,828,191 B1 | 12/2004 | Wurster et al. | |
| 6,830,676 B2 | 12/2004 | Deevi | |
| 6,831,310 B1 | 12/2004 | Mathew et al. | |
| 6,839,280 B1 | 1/2005 | Chindalore et al. | |
| 6,842,370 B2 | 1/2005 | Forbes | |
| 6,844,319 B1 | 1/2005 | Poelstra et al. | |
| 6,849,948 B2 | 2/2005 | Chen et al. | |
| 6,853,587 B2 | 2/2005 | Forbes | |
| 6,859,093 B1 | 2/2005 | Beigel | |
| 6,863,933 B2 | 3/2005 | Cramer et al. | |
| 6,878,602 B2 | 4/2005 | Basceri et al. | |
| 6,884,739 B2 | 4/2005 | Ahn et al. | |
| 6,887,758 B2 | 5/2005 | Chindalore et al. | |
| 6,888,739 B2 | 5/2005 | Forbes | |
| 6,896,617 B2 | 5/2005 | Daly | |
| 6,917,112 B2 | 7/2005 | Basceri et al. | |
| 6,921,702 B2 | 7/2005 | Ahn et al. | |
| 6,933,225 B2 | 8/2005 | Werkhoven et al. | |

| | | | | | |
|---|---|---|---|---|---|
| 6,950,340 B2 | 9/2005 | Bhattacharyya | 2003/0148577 A1 | 8/2003 | Merkulov et al. |
| 6,952,032 B2 | 10/2005 | Forbes et al. | 2003/0152700 A1 | 8/2003 | Asmussen et al. |
| 6,955,968 B2 | 10/2005 | Forbes et al. | 2003/0161782 A1 | 8/2003 | Kim |
| 6,958,265 B2 * | 10/2005 | Steimle et al. ............ 438/211 | 2003/0162587 A1 | 8/2003 | Tanamoto et al. |
| 6,958,937 B2 | 10/2005 | Forbes et al. | 2003/0175411 A1 | 9/2003 | Kodas et al. |
| 6,963,103 B2 | 11/2005 | Forbes | 2003/0176049 A1 | 9/2003 | Hegde et al. |
| 6,982,230 B2 | 1/2006 | Cabral, Jr. et al. | 2003/0183306 A1 | 10/2003 | Hehmann et al. |
| 6,991,984 B2 * | 1/2006 | Ingersoll et al. ............ 438/257 | 2003/0183901 A1 | 10/2003 | Kanda et al. |
| 7,005,697 B2 | 2/2006 | Batra et al. | 2003/0185983 A1 | 10/2003 | Morfill et al. |
| 7,012,297 B2 | 3/2006 | Bhattacharyya | 2003/0196513 A1 | 10/2003 | Phillips et al. |
| 7,019,351 B2 | 3/2006 | Eppich et al. | 2003/0207593 A1 | 11/2003 | Derderian et al. |
| 7,026,694 B2 | 4/2006 | Ahn et al. | 2003/0218199 A1 | 11/2003 | Forbes et al. |
| 7,037,574 B2 | 5/2006 | Paranjpe et al. | 2003/0230479 A1 | 12/2003 | Sarkas et al. |
| 7,042,043 B2 | 5/2006 | Forbes et al. | 2003/0231992 A1 | 12/2003 | Sarkas et al. |
| 7,049,192 B2 | 5/2006 | Ahn et al. | 2003/0234420 A1 | 12/2003 | Forbes |
| 7,068,544 B2 | 6/2006 | Forbes et al. | 2003/0235064 A1 | 12/2003 | Batra et al. |
| 7,074,673 B2 | 7/2006 | Forbes | 2003/0235066 A1 | 12/2003 | Forbes |
| 7,075,829 B2 | 7/2006 | Forbes | 2003/0235076 A1 | 12/2003 | Forbes |
| 7,084,078 B2 | 8/2006 | Ahn et al. | 2003/0235085 A1 | 12/2003 | Forbes |
| 7,087,954 B2 | 8/2006 | Forbes | 2003/0235961 A1 | 12/2003 | Metzner et al. |
| 7,112,841 B2 | 9/2006 | Eldridge et al. | 2004/0004247 A1 | 1/2004 | Forbes |
| 7,129,553 B2 | 10/2006 | Ahn et al. | 2004/0009118 A1 | 1/2004 | Phillips et al. |
| 7,132,329 B1 | 11/2006 | Hong et al. | 2004/0014060 A1 | 1/2004 | Hoheisel et al. |
| 7,135,734 B2 | 11/2006 | Eldridge et al. | 2004/0023516 A1 | 2/2004 | Londergan et al. |
| 7,138,336 B2 | 11/2006 | Lee et al. | 2004/0032773 A1 | 2/2004 | Forbes |
| 7,160,817 B2 | 1/2007 | Marsh | 2004/0033701 A1 | 2/2004 | Ahn et al. |
| 7,166,886 B2 | 1/2007 | Forbes | 2004/0041208 A1 | 3/2004 | Bhattacharyya |
| 7,169,673 B2 | 1/2007 | Ahn et al. | 2004/0042128 A1 | 3/2004 | Slaughter et al. |
| 7,187,587 B2 | 3/2007 | Forbes | 2004/0043577 A1 | 3/2004 | Hill |
| 7,192,824 B2 | 3/2007 | Ahn et al. | 2004/0045807 A1 | 3/2004 | Sarkas et al. |
| 7,192,892 B2 | 3/2007 | Ahn et al. | 2004/0046130 A1 | 3/2004 | Rao et al. |
| 7,195,999 B2 | 3/2007 | Forbes et al. | 2004/0051139 A1 | 3/2004 | Kanda et al. |
| 7,199,023 B2 | 4/2007 | Ahn et al. | 2004/0055892 A1 | 3/2004 | Oh et al. |
| 7,205,218 B2 | 4/2007 | Ahn et al. | 2004/0058385 A1 | 3/2004 | Abel et al. |
| 7,221,017 B2 | 5/2007 | Forbes et al. | 2004/0065171 A1 | 4/2004 | Hearley et al. |
| 7,221,586 B2 | 5/2007 | Forbes et al. | 2004/0086897 A1 | 5/2004 | Mirkin et al. |
| 7,235,501 B2 | 6/2007 | Ahn et al. | 2004/0107906 A1 | 6/2004 | Collins et al. |
| 7,235,854 B2 | 6/2007 | Ahn et al. | 2004/0110347 A1 | 6/2004 | Yamashita |
| 7,250,338 B2 | 7/2007 | Bhattacharyya | 2004/0126649 A1 | 7/2004 | Chen et al. |
| 7,274,067 B2 | 9/2007 | Forbes | 2004/0127001 A1 | 7/2004 | Colburn et al. |
| 7,279,413 B2 | 10/2007 | Park et al. | 2004/0130951 A1 | 7/2004 | Forbes |
| 7,297,617 B2 | 11/2007 | Farrar et al. | 2004/0131795 A1 | 7/2004 | Kuo et al. |
| 7,301,221 B2 | 11/2007 | Farrar et al. | 2004/0131865 A1 | 7/2004 | Kim et al. |
| 7,309,664 B1 | 12/2007 | Marzolin et al. | 2004/0135951 A1 | 7/2004 | Stumbo et al. |
| 7,312,494 B2 | 12/2007 | Ahn et al. | 2004/0135997 A1 | 7/2004 | Chan et al. |
| 7,326,980 B2 | 2/2008 | Ahn et al. | 2004/0145001 A1 | 7/2004 | Kanda et al. |
| 7,498,230 B2 | 3/2009 | Ahn et al. | 2004/0147098 A1 | 7/2004 | Mazen et al. |
| 7,517,783 B2 | 4/2009 | Ahn et al. | 2004/0149759 A1 | 8/2004 | Moser et al. |
| 7,575,978 B2 | 8/2009 | Kraus et al. | 2004/0158028 A1 | 8/2004 | Buhler |
| 2001/0012698 A1 | 8/2001 | Hayashi et al. | 2004/0165412 A1 | 8/2004 | Forbes |
| 2002/0000593 A1 | 1/2002 | Nishiyama et al. | 2004/0202032 A1 | 10/2004 | Forbes |
| 2002/0013052 A1 | 1/2002 | Visokay | 2004/0206957 A1 | 10/2004 | Inoue et al. |
| 2002/0019116 A1 | 2/2002 | Sandhu et al. | 2004/0212426 A1 | 10/2004 | Beigel |
| 2002/0019125 A1 | 2/2002 | Juengling et al. | 2004/0219783 A1 | 11/2004 | Ahn et al. |
| 2002/0037320 A1 | 3/2002 | Denes et al. | 2004/0224505 A1 | 11/2004 | Nguyen et al. |
| 2002/0037603 A1 | 3/2002 | Eldridge et al. | 2004/0245085 A1 | 12/2004 | Srinivasan |
| 2002/0046993 A1 | 4/2002 | Peterson et al. | 2004/0258192 A1 | 12/2004 | Angeliu et al. |
| 2002/0119916 A1 | 8/2002 | Hassan | 2004/0266107 A1 | 12/2004 | Chindalore et al. |
| 2002/0120297 A1 | 8/2002 | Shadduck | 2005/0007820 A1 | 1/2005 | Chindalore et al. |
| 2002/0132374 A1 | 9/2002 | Basceri et al. | 2005/0011748 A1 | 1/2005 | Beck et al. |
| 2002/0148566 A1 | 10/2002 | Kitano et al. | 2005/0019365 A1 | 1/2005 | Frauchiger et al. |
| 2002/0170671 A1 | 11/2002 | Matsushita et al. | 2005/0019836 A1 | 1/2005 | Vogel et al. |
| 2002/0187091 A1 | 12/2002 | Deevi | 2005/0023574 A1 | 2/2005 | Forbes et al. |
| 2002/0190251 A1 | 12/2002 | Kunitake et al. | 2005/0023584 A1 | 2/2005 | Derderian et al. |
| 2002/0192366 A1 | 12/2002 | Cramer et al. | 2005/0023594 A1 | 2/2005 | Ahn et al. |
| 2002/0193040 A1 | 12/2002 | Zhou | 2005/0026349 A1 | 2/2005 | Forbes et al. |
| 2002/0197793 A1 | 12/2002 | Dornfest et al. | 2005/0026375 A1 | 2/2005 | Forbes |
| 2003/0001190 A1 | 1/2003 | Basceri et al. | 2005/0029547 A1 | 2/2005 | Ahn et al. |
| 2003/0003635 A1 | 1/2003 | Paranjpe et al. | 2005/0031785 A1 | 2/2005 | Carlisle et al. |
| 2003/0008243 A1 | 1/2003 | Ahn et al. | 2005/0035430 A1 | 2/2005 | Beigel |
| 2003/0030074 A1 | 2/2003 | Walker et al. | 2005/0036370 A1 | 2/2005 | Forbes |
| 2003/0042534 A1 | 3/2003 | Bhattacharyya | 2005/0037374 A1 | 2/2005 | Melker et al. |
| 2003/0049900 A1 | 3/2003 | Forbes et al. | 2005/0040034 A1 | 2/2005 | Landgraf et al. |
| 2003/0096490 A1 | 5/2003 | Borland et al. | 2005/0041455 A1 | 2/2005 | Beigel et al. |
| 2003/0106490 A1 | 6/2003 | Jallepally et al. | 2005/0041503 A1 | 2/2005 | Chindalore et al. |
| 2003/0107402 A1 | 6/2003 | Forbes et al. | 2005/0048414 A1 | 3/2005 | Harnack et al. |
| 2003/0108612 A1 | 6/2003 | Xu et al. | 2005/0048570 A1 | 3/2005 | Weber et al. |
| 2003/0141560 A1 | 7/2003 | Sun | 2005/0048796 A1 | 3/2005 | Numasawa et al. |
| 2003/0143801 A1 | 7/2003 | Basceri et al. | 2005/0053826 A1 | 3/2005 | Wang et al. |

| | | |
|---|---|---|
| 2005/0061785 A1 | 3/2005 | Schroder et al. |
| 2005/0064185 A1 | 3/2005 | Buretea et al. |
| 2005/0077519 A1 | 4/2005 | Ahn et al. |
| 2005/0124174 A1 | 6/2005 | Ahn et al. |
| 2005/0151261 A1 | 7/2005 | Kellar et al. |
| 2005/0157549 A1 | 7/2005 | Mokhlesi et al. |
| 2005/0169054 A1 | 8/2005 | Forbes |
| 2005/0181624 A1* | 8/2005 | Kammler et al. ............ 438/766 |
| 2005/0277256 A1 | 12/2005 | Ahn et al. |
| 2006/0001151 A1 | 1/2006 | Ahn et al. |
| 2006/0008966 A1 | 1/2006 | Forbes et al. |
| 2006/0024975 A1 | 2/2006 | Ahn et al. |
| 2006/0027882 A1 | 2/2006 | Mokhlesi |
| 2006/0035405 A1 | 2/2006 | Park et al. |
| 2006/0043504 A1 | 3/2006 | Ahn et al. |
| 2006/0046383 A1 | 3/2006 | Chen et al. |
| 2006/0046384 A1 | 3/2006 | Joo et al. |
| 2006/0105523 A1 | 5/2006 | Afzali-Ardakani et al. |
| 2006/0118853 A1 | 6/2006 | Takata et al. |
| 2006/0125030 A1 | 6/2006 | Ahn et al. |
| 2006/0170032 A1 | 8/2006 | Bhattacharyya |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0194438 A1 | 8/2006 | Rao et al. |
| 2006/0228868 A1 | 10/2006 | Ahn et al. |
| 2006/0231889 A1 | 10/2006 | Chen et al. |
| 2006/0237764 A1 | 10/2006 | Ahn et al. |
| 2006/0246741 A1 | 11/2006 | Ahn et al. |
| 2006/0252202 A1 | 11/2006 | Dai et al. |
| 2006/0252211 A1 | 11/2006 | Ahn et al. |
| 2006/0258097 A1 | 11/2006 | Forbes et al. |
| 2006/0261376 A1 | 11/2006 | Forbes et al. |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0274580 A1 | 12/2006 | Forbes |
| 2006/0284246 A1 | 12/2006 | Forbes et al. |
| 2007/0020835 A1 | 1/2007 | Ahn et al. |
| 2007/0047319 A1 | 3/2007 | Bhattacharyya |
| 2007/0048953 A1 | 3/2007 | Gealy et al. |
| 2007/0048989 A1 | 3/2007 | Ahn et al. |
| 2007/0049023 A1 | 3/2007 | Ahn et al. |
| 2007/0087563 A1 | 4/2007 | Ahn et al. |
| 2007/0090441 A1 | 4/2007 | Ahn et al. |
| 2007/0105313 A1 | 5/2007 | Forbes |
| 2007/0111544 A1 | 5/2007 | Ahn |
| 2007/0141832 A1 | 6/2007 | Farrar |
| 2007/0178643 A1 | 8/2007 | Forbes et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2008/0032424 A1 | 2/2008 | Ahn et al. |
| 2008/0048225 A1 | 2/2008 | Ahn et al. |
| 2008/0057659 A1 | 3/2008 | Forbes |
| 2008/0057690 A1 | 3/2008 | Forbes |
| 2008/0087890 A1 | 4/2008 | Ahn et al. |
| 2008/0121962 A1 | 5/2008 | Forbes et al. |
| 2008/0193791 A1 | 8/2008 | Ahn et al. |
| 2008/0194094 A1 | 8/2008 | Ahn et al. |
| 2009/0302371 A1 | 12/2009 | Kraus et al. |

OTHER PUBLICATIONS

Atanassova, E., et al., "Breakdown Fields and Conduction Mechanisms in thin Ta2O5 Layers on Si for high density DRAMs", *Microelectronics Reliability*, 42, (2002), 157-173.

Dover, V., et al., "Deposition of Uniform Zr-Sn-Ti-O Films by On-Axis Reactive Sputtering", *IEEE Electron Device Letters*, vol. 19, No. 9, (Sep. 1998), 329-331.

Engelhardt, M., "Modern Applications of Plasma Etching and Patterning in Silicon Process Technology", *Contributions to Plasma Physics*, 39(5), (1999), 473-478.

Krauter, G., et al., "Room Temperature Silicon Wafer Bonding with Ultra-Thin Polymer Films", *Advanced Materials*, 9(5), (1997), 417-420.

Lee, C., et al., "Self-Assembly of Metal Nanocrystals on Ultrathin Oxide for Nonvolatile Memory Applications", *J. Elect. Mater*; vol. 34(1), (Jan. 2005), 1-11.

Leskela, M, "ALD precursor chemistry: Evolution and future challenges", *Journal de Physique IV (Proceedings)*, 9(8), (Sep. 1999), 837-852.

Liu, Z., et al., "Metal Nanocrystal Memories—Part I: Device Design and Fabrication", *IEEE Trans. Elect. Dev*; vol. 49(9), (Sep. 2002), 1606-1613.

Reidy, S., et al., "Comparison of two surface preparations used in the homoepitaxial growth of silicon films by plasma enhanced chemical vapor deposition", *J. Vac. Sci. Technol.* B 21(3), (May/Jun.), 970-974.

Rhee, H. S, et al., "Cobalt Metallorganic Chemical Vapor Deposition and Formation of Epitaxial CoSI2 Layer on Si(100) Substrate", *Journal of Electrochemical Society*, 146(6), (1999), 2720-2724.

Sneh, Ofer, "Thin film atomic layer deposition equipment for semiconductor processing", *Thin Solid Films*, 402(1-2), Preparation and Characterization, Elsevier Sequoia, NL, vol. 402, No. 1-2, (2002), 248-261.

Su, D. K., et al., "Experimental Results and Modeling Techniques for Substrate Noise in Mixed-Signal Integrated Circuits", *IEEE Journal of Solid-State Circuits*, 28(4), (Apr. 1993), 420-430.

Suntola, T., "Atomic Layer Epitaxy", *Handbook of Crystal Growth, 3; Thin Films of Epitaxy, Part B: Growth Mechanics and Dynamics*, Amsterdam, (1994), 601-663.

Suntola, Tuomo, "Atomic layer epitaxy", *Thin Solid Films*, 216(1), (Aug. 28, 1992), 84-89.

Wilk, G. D., "High-K gate dielectrics: Current status and materials properties considerations", *Journal of Applied Physics*, 89(10), (May 2001), 5243-5275.

* cited by examiner

DEVICES WITH NANOCRYSTALS AND METHODS OF FORMATION

TECHNICAL FIELD

This application relates generally to semiconductor devices and device fabrication and, more particularly, to forming nanocrystals and other nanostructures.

BACKGROUND

The semiconductor device industry has a market driven need to reduce the size and cost of integrated circuits (ICs), including persistent memory devices such as floating gate memory and flash memory. As the dimensions of the memory devices are reduced, the voltage used to program the gates is reduced for reliability reasons associated with the thinner gate dielectric thickness. The thinner gate dielectrics for the smaller IC dimensions may have problems with leakage current levels, and thus the length of time the individual gate can retain the programmed charge may not be sufficient.

The floating gate of flash memory devices can be replaced with small crystals. These small crystals have been referred to as nanocrystals. The nanocrystals are located over the channel region, and separated from the channel region by a gate dielectric. The nanocrystals should be distributed and be capable of holding a sufficient charge so that, if programmed to hold charge, the nanocrystals will control the channel region below the nanocrystals as well as the region between the nanocrystals. Too few nanocrystals, over the entire channel or a portion of the channel, may not be able to control the channel. Too many nanocrystals, over the entire channel or a portion of the channel, may result in a leakage path in the gate dielectric such that some of the charge stored on the nanocrystals may be lost.

SUMMARY

The above-mentioned issues are addressed herein and will be understood by reading and studying the following specification. Disclosed herein, among other things, is a method for providing a controllable distribution of the nucleation sites across the surface of the substrate for use in growing nanoscale structures. Thus, the density and spatial distribution of nanostructures, such as nanocrystals, can be controlled. In nonvolatile memory embodiments where the nanocrystals function as a floating gate, the distribution and size of the nanocrystals is sufficiently uniform to hold a charge sufficient to control the channel region.

An aspect relates to a method of growing nanoscale structures on a semiconductor substrate. According to various embodiments, nucleation sites are created on a surface of the substrate. The creation of the nucleation sites includes implanting ions with an energy and a dose selected to provide a controllable distribution of the nucleation sites across the surface of the substrate. Nanoscale structures are grown using the controllable distribution of nucleation sites to seed the growth of the nanoscale structures. According to various embodiments, the nanoscale structures include at least one of nanocrystals, nanowires and nanotubes. According to various nanocrystal embodiments, the nanocrystals are positioned within a gate stack and function as a floating gate for a nonvolatile device.

An aspect relates to a method of growing nanocrystals on a semiconductor substrate. According to various embodiments, nucleation sites are created on a surface of the substrate. The creation of the nucleation sites includes including implanting ions with an energy and a dose selected to provide a controllable distribution of the nucleation sites across the surface of the substrate. Material is deposited to grow nanocrystals using the controllable distribution of nucleation sites to seed the growth of the nanocrystals.

These and other aspects, embodiments, advantages, and features will become apparent from the following description and the referenced drawings.

DETAILED DESCRIPTION

Figure 1:
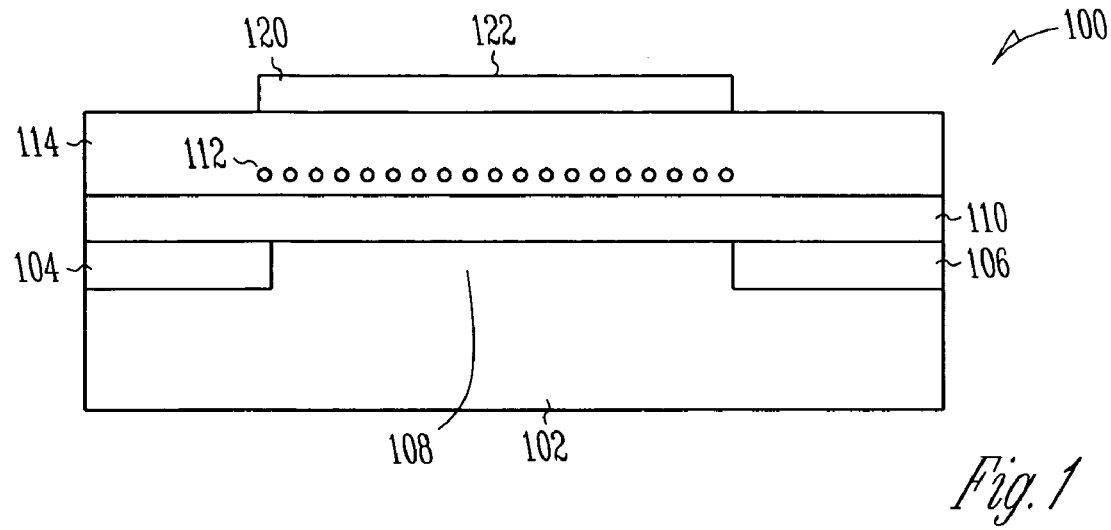
FIG. 1 illustrates an embodiment of a floating gate transistor.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments. The following detailed description is, therefore, not to be taken in a limiting sense, and the scope of the present invention is defined only by the appended claims, along with the full scope of equivalents to which such claims are entitled.

The terms "wafer" and "substrate" used in the following description include any structure having an exposed surface with which to form an integrated circuit (IC) structure or a micro electromechanical (MEM) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors. The term "high work function" is understood to generally include all materials having a higher work function than that of heavily doped polycrystalline silicon. The term "high dielectric constant" is understood to generally include all materials having a higher dielectric constant than the 3.9 value of silicon dioxide. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side"(as in "sidewall"), "higher", "lower", "over" and "under" are defined with respect to the conventional plane or surface being on the top surface of the wafer or substrate, regardless of the orientation of the wafer or substrate.

The present subject matter provides a method for creating nucleation sites with a controllable density and distribution for use in growing nanoscale structures. The processes illustrated in this disclosure can be used to provide devices with nanoscale structures with a controllable density and distribution. Examples of nanoscale structures include nanocrystals, nanowires, and nanotubes. To simplify the disclosure, a nonvolatile memory embodiment with a floating gate formed by nanocrystals is discussed below. Those of ordinary skill in the art will understand, upon reading and comprehending this disclosure, how to control the density and distribution of nanostructures, such as nanocrystals, nanowires and nanotubes.

A gate dielectric in a transistor has both a physical gate dielectric thickness and what may be referred to as an equivalent oxide thickness, using the silicon dioxide ($SiO_2$) gate dielectric as the standard of comparison. The equivalent oxide thickness is a measure of the electrical properties of the gate dielectric, such as capacitance per unit area. Equivalent oxide thickness refers to the thickness of a theoretical $SiO_2$ layer that would have the same electrical properties as the dielectric layer, and is often useful when dealing with gate dielectrics having dielectric constants that are higher than the 3.9 value of silicon dioxide. High dielectric constant materials are useful in transistors of reduced dimensions. The physical thickness of the high dielectric may be much larger than the electrical equivalent value, and thus higher transistor speed may be obtained without the increased leakage rate and decreased reliability that would be found in an equivalent silicon dioxide gate dielectric. For example, a dielectric material with a dielectric constant of 10 would have a physical thickness of 2.5 nanometers to provide the same speed performance as a silicon dioxide thickness of only 1.0 nanometer, and would have better leakage characteristics due to the greater physical thickness. A high dielectric constant gate dielectric may be useful in the present subject matter, including the reduced leakage current values from the individual nanocrystals of the floating gate to the substrate, resulting in increased data retention values. High work function material may be useful in the present subject matter by adjusting the tunneling barrier to adjust the programming barriers and speed.

FIG. 1 illustrates an embodiment of a floating gate transistor 100 having a substrate 102, a source diffusion region 104 having an opposite doping type from the substrate, and a drain diffusion region 106, having the same doping type as the source region 104. The area of the substrate 102 between the source 104 and the drain 106 is known as the channel. The channel allows conduction between the source and drain if the gate 112 has an appropriate charge. The amount of charge on the gate 112 needed to allow conduction depends on factors including the thickness and dielectric constant of the gate insulator 110, the doping level of the substrate 102 and the channel 108, and leakage between the gate 112 and the substrate. The gate 112 in the present embodiment is what is known as a floating gate that has no direct electrical connection to any signal, electrode or substrate, and is formed of many small closely spaced nanoparticles in non contacting proximity to one another. These small closely spaced nanoparticles may be known as nanocrystals and act as a single electrode if the spaces between the nanocrystals are small enough to control the region of the channel 108 surrounding the nanocrystal. A floating gate formed from nanocrystals has also been referred to as a floating plate. The transistor 100 also includes an inter-gate dielectric layer 114 and a control electrode 120, which may be formed of any gate electrode material. The control electrode is connected to signal over conductor 122.

Nanocrystals such as those of floating electrode 112 may be grown in a number of ways using well known methods such as atomic layer deposition (ALD), chemical vapor deposition (CVD), plasma enhanced CVD (PECVD), physical vapor deposition (PVD), and spin coating. Various nanocrystal embodiments include metals and various nanocrystal embodiments include insulators. For example, the nanocrystals may be made of any gate electrode material, including high work function materials. Various nanocrystal embodiments include platinum (Pt), various nanocrystal embodiments include rhodium (Rh), various nanocrystal embodiments include ruthenium (Ru), various nanocrystal embodiments include palladium (Pd), various nanocrystal embodiments include cobalt (Co), various nanocrystal embodiments include silicon (Si), various nanocrystal embodiments include titanium (Ti), various nanocrystal embodiments include zirconium (Zr), various nanocrystal embodiments include hafnium (Hf), various nanocrystal embodiments include tantalum (Ta), various nanocrystal embodiments include tungsten (W), various nanocrystal embodiments include tantalum nitride (TaN), various nanocrystal embodiments include titanium nitride (TiN), various nanocrystal embodiments include tungsten nitride (WN), various nanocrystal embodiments include titanium oxide ($TiO_x$), various nanocrystal embodiments include cobalt oxide ($CoO_x$), various nanocrystal embodiments include ruthenium oxide ($RuO_x$), various nanocrystal embodiments include hafnium oxide ($HfO_x$), various nanocrystal embodiments include aluminum oxide ($Al_2O_3$), various nanocrystal embodiments include tungsten oxide ($WO_x$), various nanocrystal embodiments include titanium carbide (TiC), various nanocrystal embodiments include tantalum carbide (TaC), various nanocrystal embodiments include tungsten carbide (WC), and various nanocrystal embodiments include various combinations of these materials.

If the nanocrystals of floating gate 112 are substantially in direct electrical contact with one another, then the floating gate will function as a single gate electrode. If there is a leakage path somewhere in the gate insulator 110, then the charge stored in the gate electrode 112 will disappear over time, and the data retention of the transistor 100 will be unacceptable. Even if the entire floating gate 112 does not discharge, but a substantial portion of the gate electrode 112 has a leakage path, then the channel region will block or limit current flow in the region of the channel 108 corresponding to the leakage path, and the transistor 100 will either be non-conductive, or conductive at a level too low for proper operation.

With respect to nonvolatile memory embodiments with floating gates formed from nanocrystals, it is desired to have the floating gate nanocrystals close enough together to electrically control the space between the nanocrystals, but not to have the nanocrystals be too large or to be in direct electrical contact with each other. For example, one sub-50 nm nonvolatile memory embodiment has approximately 100 nanocrystals in a 40 by 40 nanometer channel region, with the nanocrystals being around 2 nanometers in size and about 2 nanometers in separation from one another. Other embodiments are anticipated to accommodate other device dimensions, and other structures with nanocrystal distributions are contemplated.

One method to provide control of the size and spacing of the nanocrystals provides nucleation sites to initiate the ALD or CVD chemical reactions to begin to form nanocrystals. The nucleation sites may be formed by damage locations in the top surface of the gate dielectric, or by ion implantation of atoms into or onto the top surface of the dielectric. Normal energy ion implantation energies such as fifteen thousand electron volts (15 KeV) using boron ions may result in inadequate dielectric damage at the surface and undesirable amounts of damage deeper in the gate dielectric, resulting in leakage paths or short circuits due to the relatively high speed of the ion. Low energy ion implantation resulting in ions or atoms that stick out of the surface of the gate dielectric may most efficiently form the nucleation sites.

Figure 2:
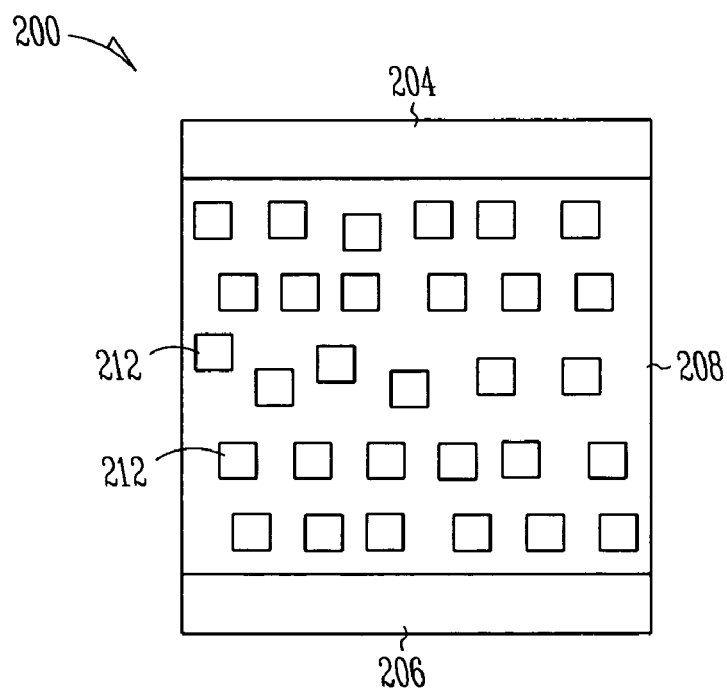
FIG. 2 shows a top view of a transistor channel region for a floating gate transistor embodiment.

FIG. 2 shows a top view of a transistor channel region for a floating gate transistor embodiment. The illustrated transistor 200 has a source diffusion region 204, a drain diffusion region 206, and a channel region 208. A gate dielectric is not shown for simplicity. A number of nanocrystals 212 are distributed substantially evenly over the entire area of the channel 208. In the illustration, none of the nanocrystals are touching one another. According to a sub-50 nm nonvolatile memory embodiment, the channel region is about 40 nanometers on a side and contains about 100 nanocrystals having a size of about 2 nanometers and a spacing of about 2 nanometers. Not all of the nanocrystals will be exactly 2 nanometers and have a 2 nanometer spacing, nor will every nanocrystal be electrically isolated as shown in the figure. However, the present subject matter is capable of providing nanocrystals with substantially even distribution in size and in spacing. If the spacing becomes too large, then regions of the channel 208 will not be turned on as programmed, resulting in either lower source 204 to drain 206 conduction, or an open circuit. Leakage paths can potentially develop if the nanocrystals 212 are too large or in direct electrical contact. Such leakage paths across the gate dielectric will reduce the charge stored by the corresponding nanocrystals, and potentially result in regions of the channel 208 that are not as conductive as desired, and potentially result in reduced data retention periods.

Figure 3:
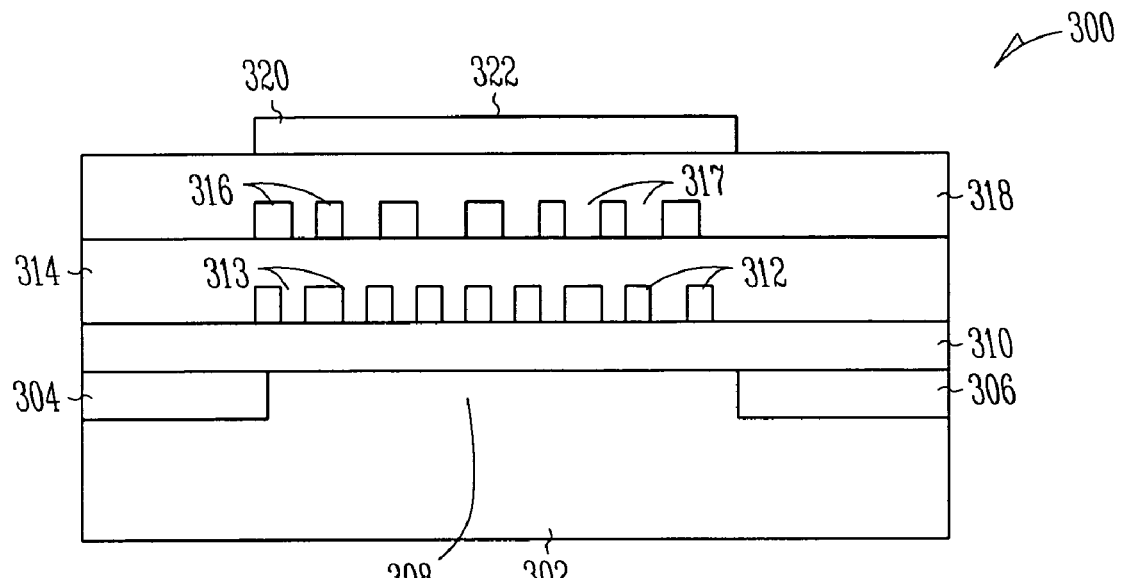
FIG. 3 illustrates an embodiment of a transistor having one or more levels of nanocrystal floating gates.

FIG. 3 illustrates an embodiment of a transistor having one or more levels of nanocrystal floating gates. In this illustrative embodiment the nanocrystals are shown as individual elements with a first layer of nanocrystals 312 and a second layer of nanocrystals 316. The present subject matter has embodiments having only a single layer of nanocrystals 312, or two, three or even more individual layers of nanocrystals. Each of the individual layers of nanocrystals may have a controlled size crystal and a substantially uniform distribution of electrically isolated nanocrystals. This illustrative embodiment has a transistor 300 formed on a substrate 302, which may be a silicon substrate of either P type or N type, an epitaxial layer grown on a silicon substrate or on an insulative substrate such as sapphire. The substrate may also be all other semiconductive material such as amorphous silicon, polycrystalline silicon, germanium, gallium arsenide, or any other compound semiconductor and still be within the inventive subject matter. The substrate has a source region 304 and a drain region 306 with a channel region 308 between the source and drain. There is a gate dielectric 310, which may be silicon oxide, silicon nitride, silicon oxynitride, or any other dielectric or insulative material, including high dielectric constant materials such as alumina, titanium dioxide, hafnium dioxide, tantalum dioxide, barium titanate, and the like. The gate dielectric 310 separates the floating gate electrode 312 from the channel region and the source and drain regions. The gate electrode 312 in this embodiment is formed of individual nanocrystals 312 of material capable of storing a charge. For example, the nanocrystals can be formed from any gate electrode material, such as polysilicon, refractory metals such as tungsten, high work function materials such as silicon carbide, or other conductive material or semiconductor material capable of forming nanocrystals with the desired properties to function as the floating gate of a floating gate nonvolatile memory device. The nanocrystals also can be formed from insulators, such as $RuO_x$, $CoO_x$, $TiO_2$ and the like. The first floating gate 312 has spaces 313 between each of the nanocrystals so that the nanocrystals are electrically isolated from each other. The first layer of nanocrystals has a first inter-gate dielectric layer 314, which may be formed of any dielectric material as above, upon which a second layer of nanocrystals 316 is formed as above with reference to the first layer of nanocrystals 312. The second layer of nanocrystals 316 has spaces 317 separating the nanocrystals. The second layer of nanocrystals has a second inter-gate dielectric layer 318 formed as above, which separates the second nanocrystal layer from the control gate 320, which is connected to an input signal 322 from either an adjacent transistor or from an external source. The formation of the dielectric layers can use a variety of processes, such as chemical vapor deposition, atomic layer deposition, evaporation, and the like, as may be appropriate for the dielectric type and size. Any dielectric deposition technique may be used which results in very conformal coverage of nanocrystals and which provides a good quality dielectric with degradation of the nanocrystals. Degradation of nanocrystals may occur because of the temperature or corrosiveness of the deposition temperature. There may be additional layers of nanocrystal floating gates formed in the same manner. Such transistors as those discussed in FIGS. 1 to 3 may be used in logic devices as local memory, as non-volatile memory arrays such as flash memory, or in almost any electronic device. Some embodiments will treat the nanocrystals, such as illustrated at 312 or 316, before depositing their corresponding subsequent intergate dielectric, such as illustrated at 314 and 318. For example, the nanocrystals can be oxidized.

For floating gate embodiments, the size of the nanocrystals can range from about 0.5 nanometers to about 5 nanometers, and the average spacing between nanocrystals can range from about 0.5 nanometers to about 5 nanometers. It is expected that approximately 80% or more of the nanocrystals will fall within these ranges. According to various sub-50 nm non-volatile memory embodiments, an average size of the nanocrystals is 2 nanometers with a spacing between nanocrystals of about 2 nanometers. According to various embodiments, the electrically isolated nanocrystals have a maximum diameter of 4.0 nanometers and a density of greater than one nanocrystal per 15 square nanometers.

Figure 4:
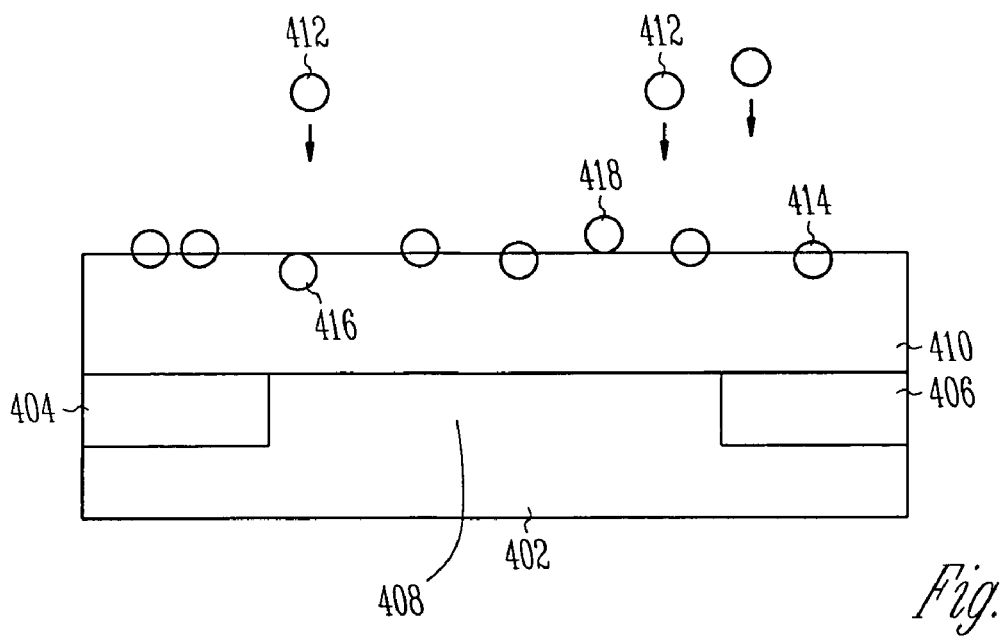
FIG. 4 illustrates an embodiment of ion implantation nucleation.

FIG. 4 illustrates an embodiment of ion implantation nucleation. The transistor is shown in an intermediate step of the manufacturing process, when a device having a semiconductive substrate 402 with source 404 and drain 406 formed on a surface of the substrate. The drawing is meant to illustrate the implantation of nucleation sites, and is not drawn to scale. There is a channel region 408 and a gate insulator layer 410. The nucleation sites may be formed over the entire wafer as shown, or only over the channel region 408 by simple photo-masking or other well known masking procedures, to limit the ion implantation to the channel region of the gate dielectric 410. The nucleation sites may be damage locations in the top surface of the gate dielectric 410 caused by the passage of relatively heavy ions such as argon, or they may be atoms of the ion implanted material sticking up from the gate dielectric surface as shown. The depth range of the implanted ion should be small to cause the ions to stop at the top surfaces, or at least near the top surface to avoid excessive gate dielectric damage. For example, according to various embodiments, the implanted ions do not travel past the top 1 nanometer of the gate dielectric layer 410 or do not travel past the top 1/5 of the gate dielectric layer 410.

The ions 412 may be formed by any method of ion formation and acceleration, including plasma systems such as plasma doping systems (PLAD). The ion energy should be low enough to prevent any of the ions 412 from moving fast enough in the direction indicated by the arrows toward the gate dielectric 410 to penetrate the gate dielectric layer. Various types of ions may be used, such as typical dopant species such as boron, phosphorous or arsenic. The ions may be of the material that will form the nanocrystals, or the ions may be of inert gases such as argon, neon, helium and xenon, or the ions may be semiconductor materials such as silicon, carbon, germanium or other ions. The dose of the ion has an affect on the uniformity of the distribution of eventual nanocrystals grown and on the size of the nanocrystals.

Typical ion energies depend upon the mass of the ion, and should be set to partially embed the ions 412 into the surface of the gate dielectric 410 either partially, as shown with ion 414, entirely embedded forming a persistent defect in the surface of the gate dielectric, as shown with ion 416, or slightly so as to remain entirely on the surface of the gate dielectric, as shown with ion 418. Typical ion energies found with PLAD are a few dozen electron volts (eV). Typical ion densities expressed in the number of ions per unit surface area are in the $10^{12}$ ions/cm$^2$ levels. The ions should preferably be deposited in a discontinuous layer on the surface of the gate dielectric 410. According to various floating gate embodiments for sub-50 nm memories, the range of energies for implanting boron ion(s) into a silicon dioxide gate dielectric extend from approximately 0.01 KeV to approximately 2.0 KeV with a dose of ranging from approximately 1E11 ions /cm$^2$ to approximately 1E14 ions /cm$^2$. The energy and dose ranges depend on the ions and the gate dielectric. Thus, appropriate energies and doses can be selected to implant a variety of ions on the surface or shallowly below the surface of a variety of gate dielectrics.

Structures such as shown in FIG. 1, 2, 3 or 4 may be used in any integrated circuit or transistor devices, such as flash memory devices as well as other memory, logic or information handling devices and systems. Embodiments of these information handling devices include wireless systems, telecommunication systems, computers and integrated circuits.

Figure 5:
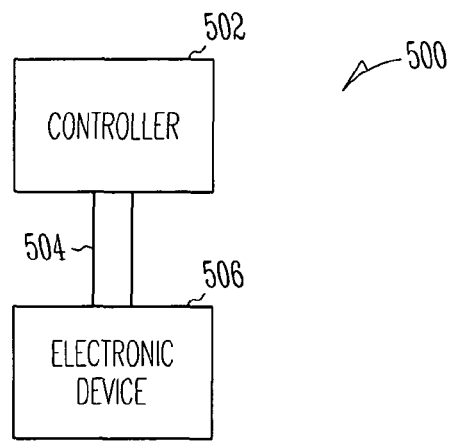
FIG. 5 is a block diagram of an embodiment of an electronic system.

FIG. 5 is a block diagram of an embodiment of an electronic system. The illustrated electronic system 500 has one or more devices having portions of the circuits with non-volatile memory devices, with nanocrystals as disclosed herein. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a portion of the device design used for nanocrystal floating gate transistors as previously discussed herein. Electronic system 500 may include, but is not limited to, information handling devices, wireless systems, telecommunication systems, fiber optic systems, electro-optic systems, and computers.

Figure 6:
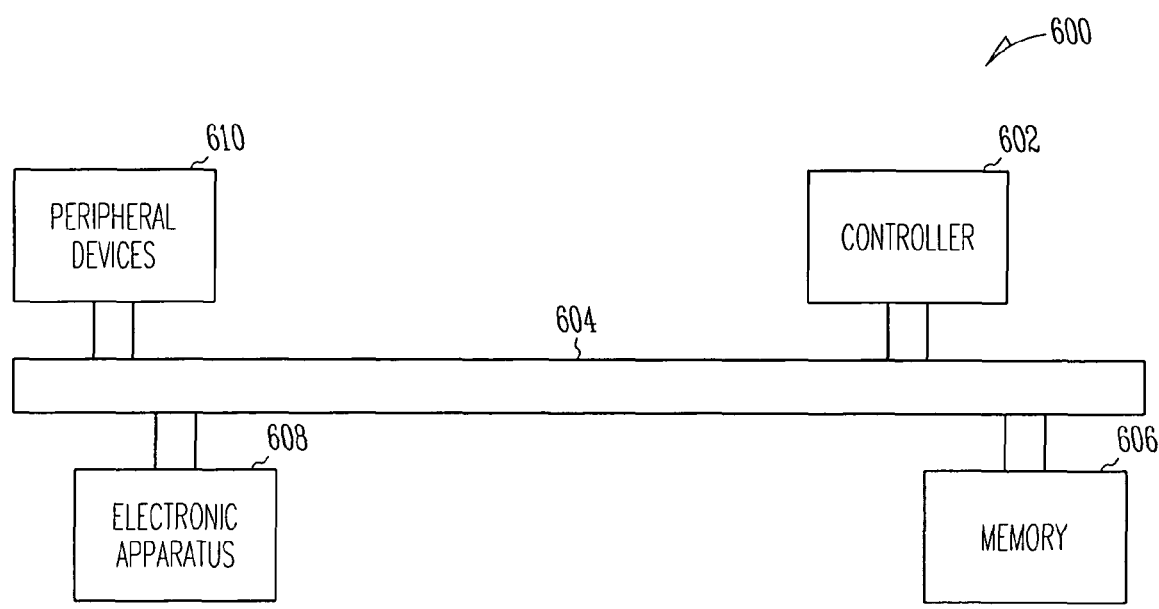
FIG. 6 is a diagram of an embodiment of an electronic system having devices.

FIG. 6 depicts a diagram of an embodiment of a system 600 having a controller 602 and a memory 606. Controller 602 and/or memory 606 include a portion of the circuit for selectively heating the device to a desired temperature. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a nonvolatile memory in accordance with the disclosed embodiments. System 600 may include, but is not limited to, information handling devices, telecommunication systems, and computers. Peripheral devices 610 may include displays, additional memory, or other control devices operating in with controller 602 and/or memory 606.

The present subject matter provides a method for creating nucleation sites with a controllable density and distribution for use in growing nanoscale structures. The nucleation sites are created using low energy ion implantation techniques to create the nucleation sites at or near the top surface of material in which the ions are implanted. Thus, the processes illustrated in this disclosure are able to seed the growth of nanoscale structures, such as nanocrystals, nanowires and nanotubes, such that the resulting nanoscale structures have a controllable density and distribution. Nanocrystals can be used for a variety of purposes, such as storing charge, enhancing tunneling, and channeling current to increase current density. The floating gate embodiment provided above is an example of a device where the nanocrystals are used to store charge. Such charge storing nanocrystals can also be used to selectively store charge in a body of a transistor in a nonvolatile memory design, such as illustrated in, for example, US Patent Application Publication 2004/0041208, entitled "One Transistor SOI Non-Volatile Random Access Memory Cell". Some embodiments may use nanocrystals to enhance tunneling, such as may be beneficial between a control gate and a floating gate. Enhanced charge tunneling is illustrated in, for example, US Patent Application Publication 2003/0042534, entitled "Scalable Flash/NV Structure and Device with Extended Endurance". Additionally, nanocrystals can be used to provide a path for a locally high current density, such as may be useful for fast ionic or phase change memory devices. Thus, a locally high current density can be provided for a relatively large electrode.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention, including but not limited to. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of growing nanoscale structures on a semiconductor substrate, comprising:
   implanting the semiconductor substrate with ions at a selected energy and a selected dose such that a controlled distribution of nucleation sites embedded in a surface of an insulative layer is formed, the surface disposed away from an interface formed by the insulative layer disposed on the semiconductor substrate, implanted material of the ions in the surface being the nucleation sites arranged to seed growth of nanoscale structures; and
   growing conductive nanoscale structures from the nucleation sites on the insulative layer by depositing material on the nucleation sites of the implanted material in the surface.

2. The method of claim 1, wherein implanting ions includes performing a plasma doping (PLAD) process.

3. The method of claim 1, wherein the implanted material of the implanted ions includes atomic elements that are also used in the conductive nanoscale structures.

4. The method of claim 1, wherein the implanted material of the implanted ions includes atomic elements different from elements comprising the conductive nanoscale structures.

5. The method of claim 1, wherein growing the conductive nanoscale structures includes performing an atomic layer deposition (ALD) process on the substrate with the nucleation sites.

6. The method of claim 1, wherein growing the conductive nanoscale structures includes performing a chemical vapor deposition (CVD) process on the substrate with the nucleation sites.

7. The method of claim 1, wherein growing the conductive nanoscale structures includes performing a physical vapor deposition (PVD) process on the substrate with the nucleation sites.

8. The method of claim 1, wherein growing the conductive nanoscale structures includes performing a spin coating process on the substrate with the nucleation sites.

9. The method of claim 1, wherein growing the conductive nanoscale structure includes growing a nanocrystal.

10. The method of claim 1, wherein growing the conductive nanoscale structure includes growing a nanowire.

11. The method of claim 1, wherein growing the conductive nanoscale structure includes growing a nanotube.

12. A method of growing nanocrystals on a semiconductor substrate, comprising:
    implanting ions into a surface of an insulative layer, the surface disposed away from an interface formed by the insulative layer disposed on the semiconductor substrate, the ions implanted at a selected energy and a selected dose forming a controlled distribution of nucleation sites embedded in the surface, implanted material of the ions, implanted in the surface, being the nucleation sites arranged to seed growth of nanoscale structures; and
    depositing material on the implanted material to grow conductive nanocrystals from the implanted material as nucleation sites on the insulative layer.

13. The method of claim 12, wherein implanting ions includes performing a plasma doping (PLAD) process.

14. The method of claim 12, wherein the energy and the dose are selected to provide nucleation sites with a desired distribution such that nanocrystal growth seeded by the nucleation sites provide charge storing nanocrystals.

15. The method of claim 14, wherein the charge storing nanocrystals are positioned within a gate stack to form a floating gate of a nonvolatile memory device.

16. The method of claim 14, wherein the charge storing nanocrystals are positioned within a transistor body of a nonvolatile memory device.

17. The method of claim 12, wherein the energy and the dose are selected to provide nucleation sites with a desired distribution such that nanocrystal growth seeded by the nucleation sites provide nanocrystals to enhance charge tunneling.

18. The method of claim 17, wherein the nanocrystals are positioned within a gate stack to enhance tunneling to and from a floating gate in a nonvolatile device.

19. The method of claim 12, wherein the energy and the dose are selected to provide nucleation sites with a desired distribution such that nanocrystals growth seeded by the nucleation sites provide nanocrystals to provide locally high current density.

20. The method of claim 12, wherein the conductive nanocrystals comprise a metal material.

21. The method of claim 12, wherein the conductive nanocrystals comprise a high work function material.

22. The method of claim 12, wherein the conductive nanocrystals comprise platinum (Pt).

23. The method of claim 12, wherein the conductive nanocrystals comprise rhodium (Rh).

24. The method of claim 12, wherein the conductive nanocrystals comprise ruthenium (Ru).

25. The method of claim 12, wherein the conductive nanocrystals comprise palladium (Pd).

26. The method of claim 12, wherein the conductive nanocrystals comprise cobalt (Co).

27. The method of claim 12, wherein the conductive nanocrystals comprise titanium (Ti).

28. The method of claim 12, wherein the conductive nanocrystals comprise zirconium (Zr).

29. The method of claim 12, wherein the conductive nanocrystals comprise hafnium (Hf).

30. The method of claim 12, wherein the conductive nanocrystals comprise tantalum (Ta).

31. The method of claim 12, wherein the conductive nanocrystals comprise tungsten (W).

32. The method of claim 12, wherein the conductive nanocrystals comprise tantalum nitride (TaN).

33. The method of claim 12, wherein the conductive nanocrystals comprise titanium nitride (TiN).

34. The method of claim 12, wherein the conductive nanocrystals comprise tungsten nitride (WN).

* * * * *